(12) United States Patent
Lee et al.

(10) Patent No.: US 10,281,764 B2
(45) Date of Patent: May 7, 2019

(54) LIQUID CRYSTAL DISPLAY DEVICE

(71) Applicant: Samsung Display Co. Ltd., Yongin-si (KR)

(72) Inventors: Seung Kyu Lee, Cheonan-si (KR); Gung Wan Nam, Asan-si (KR); Woo Sung Sohn, Seoul (KR); Mi Hyeon Jo, Iksan-si (KR); Ki Pyo Hong, Hwaseong-si (KR)

(73) Assignee: SAMSUNG DISPLAY CO. LTD., Gyeonggi-Do (KR)

( * ) Notice: Subject to any disclaimer, the term of this patent is extended or adjusted under 35 U.S.C. 154(b) by 17 days.

(21) Appl. No.: 15/654,400

(22) Filed: Jul. 19, 2017

(65) Prior Publication Data

US 2018/0088409 A1    Mar. 29, 2018

(30) Foreign Application Priority Data

Sep. 23, 2016   (KR) .................. 10-2016-0122106

(51) Int. Cl.
| | |
|---|---|
| *G02F 1/1343* | (2006.01) |
| *G02F 1/1335* | (2006.01) |
| *G02F 1/1337* | (2006.01) |
| *H01L 51/00* | (2006.01) |
| *G02F 1/163* | (2006.01) |

(52) U.S. Cl.
CPC .. *G02F 1/133528* (2013.01); *G02F 1/133509* (2013.01); *G02F 1/133512* (2013.01); *G02F 1/133707* (2013.01); *H01L 51/0024* (2013.01); *G02F 2001/1635* (2013.01)

(58) Field of Classification Search
None
See application file for complete search history.

(56) References Cited

U.S. PATENT DOCUMENTS

| | | | |
|---|---|---|---|
| 6,829,028 B2 | 12/2004 | Lai et al. | |
| 8,896,791 B2 | 11/2014 | Lim et al. | |
| 9,170,449 B2 | 10/2015 | Baek et al. | |
| 9,495,041 B2 | 11/2016 | Baek et al. | |
| 2014/0211103 A1* | 7/2014 | Baek ................ | G02F 1/133753 349/12 |

FOREIGN PATENT DOCUMENTS

| | | |
|---|---|---|
| KR | 1020130112628 | 10/2013 |
| KR | 1020140102941 | 8/2014 |
| LR | 1020170001812 | 1/2017 |

* cited by examiner

*Primary Examiner* — Richard H Kim
(74) *Attorney, Agent, or Firm* — Cantor Colburn LLP

(57) ABSTRACT

A liquid crystal display includes a first display substrate, a second display substrate facing the first display substrate, and a liquid crystal layer interposed between the first and second display substrates, where the first display substrate includes a lower substrate, a pixel electrode, which is disposed on the lower substrate, and a protrusion pattern, which is disposed on the pixel electrode along an outer edge of the pixel electrode, the second display substrate includes an upper substrate and a light-shielding member, which is disposed on a surface of the upper substrate facing the first display substrate and in which indentation pattern parts are inwardly indented in a plan view, the light-shielding member includes light-shielding parts that are an entirety of the light-shielding member except for the indentation pattern parts, and the indentation pattern parts overlap parts of the pixel electrode.

19 Claims, 7 Drawing Sheets

LIQUID CRYSTAL DISPLAY DEVICE

This application claims priority to Korean Patent Application No. 10-2016-0122106, filed on Sep. 23, 2016, and all the benefits accruing therefrom under 35 U.S.C. § 119, the content of which in its entirety is herein incorporated by reference.

BACKGROUND

1. Field

Exemplary embodiments of the invention relate to a liquid crystal display ("LCD") device.

2. Description of the Related Art

A liquid crystal display ("LCD") device, which is one of the most widely-used display devices, generally includes two substrates on which field-generating electrodes such as pixel electrodes and a common electrode are formed, respectively, and a liquid crystal layer which is inserted between the two substrates. The LCD device generates an electric field in the liquid crystal layer by applying voltages to the field-generating electrodes, respectively, and displays an image by determining an orientation of liquid crystal molecules in the liquid crystal layer and controlling a polarization of incident light using the electric field.

Particularly, a vertical alignment ("VA")-mode LCD device, which aligns the liquid crystal molecules such that long axes of the liquid crystal molecules are perpendicular to upper and lower substrates in an absence of an electric field, has been developed.

Recently, a structure in which a protrusion pattern is formed along an outer edge of each pixel electrode has been developed to strengthen control over liquid crystal molecules in the LCD device. The protrusion pattern forms a height difference, and the height difference controls the liquid crystal molecules in a particular direction, thereby improving control over the liquid crystal molecules.

In the LCD device, a light-shielding member for preventing light leakage may be provided, and a height difference may also be formed by the light-shielding member.

The height difference formed by the light-shielding member may also control the liquid crystal molecules in a particular direction.

SUMMARY

In a case in which a control force for liquid crystal molecules, generated by a light-generating member, and a control force for the liquid crystal molecules, generated by a protrusion pattern, are opposite to each other, the liquid crystal molecules may be misaligned because of insufficient control over the liquid crystal molecules. Especially in a case in which the liquid crystal molecules are misaligned by external pressure because of an insufficient control force for the liquid crystal molecules, it may not be able to correct the misaligned liquid crystal molecules.

Therefore, a structure capable of addressing a conflict in control over the liquid crystal molecules is needed.

Exemplary embodiments of the invention provide a liquid crystal display ("LCD") device which addresses a conflict in control over liquid crystal molecules that may be caused by a light-shielding member and a protrusion pattern.

However, exemplary embodiments of the invention are not restricted to those set forth herein. The above and other exemplary embodiments of the invention will become more apparent to one of ordinary skill in the art to which the invention pertains by referencing the detailed description of the invention given below.

According to an exemplary embodiment of the invention, there is provided an LCD device. The LCD device includes a first display substrate, a second display substrate facing the first display substrate, and a liquid crystal layer interposed between the first and second display substrates, where the first display substrate includes a lower substrate, a pixel electrode, which is disposed on the lower substrate, and a protrusion pattern, which is disposed on the pixel electrode along an outer edge of the pixel electrode, the second display substrate includes an upper substrate and a light-shielding member, which is disposed on a surface of the upper substrate facing the first display substrate and in which indentation pattern parts are inwardly indented in a plan view, the shielding member includes light-shielding parts that are an entirety of the light-shielding member except for the indentation pattern parts, and the indentation pattern parts overlap parts of the pixel electrode.

According to another exemplary embodiment of the invention, there is provided an LCD device. The LCD device includes a first display substrate having a plurality of pixels arranged in a matrix, a second display substrate facing the first display substrate, and a liquid crystal layer interposed between the first and second display substrates, where the first display substrate includes a lower substrate, a pixel electrode, which is disposed on the lower substrate and is provided for each of the plurality of pixels, and a protrusion pattern, which is disposed on the pixel electrode along an outer edge of the pixel electrode, the second display substrate includes an upper substrate and a light-shielding member, which is disposed on a surface of the upper substrate facing the first display substrate and extends across the plurality of pixels along a first direction, and the light-shielding member in which indentation pattern parts are indented from an edge of the light-shielding member along a second direction that is perpendicular to the first direction in a plan view, and the light-shielding member includes light-shielding parts, which are an entirety of the light-shielding member except for the indentation pattern parts.

According to the aforementioned and other exemplary embodiments of the invention, an LCD device capable of addressing a conflict in control over liquid crystal molecules that may be caused by a light-shielding member and a protrusion pattern may be provided.

Other features and exemplary embodiments may be apparent from the following detailed description, the drawings, and the claims.

BRIEF DESCRIPTION OF THE DRAWINGS

The above and other exemplary embodiments and features of the invention will become more apparent by describing in detail exemplary embodiments thereof with reference to the attached drawings, in which.

DETAILED DESCRIPTION

Figure 1:
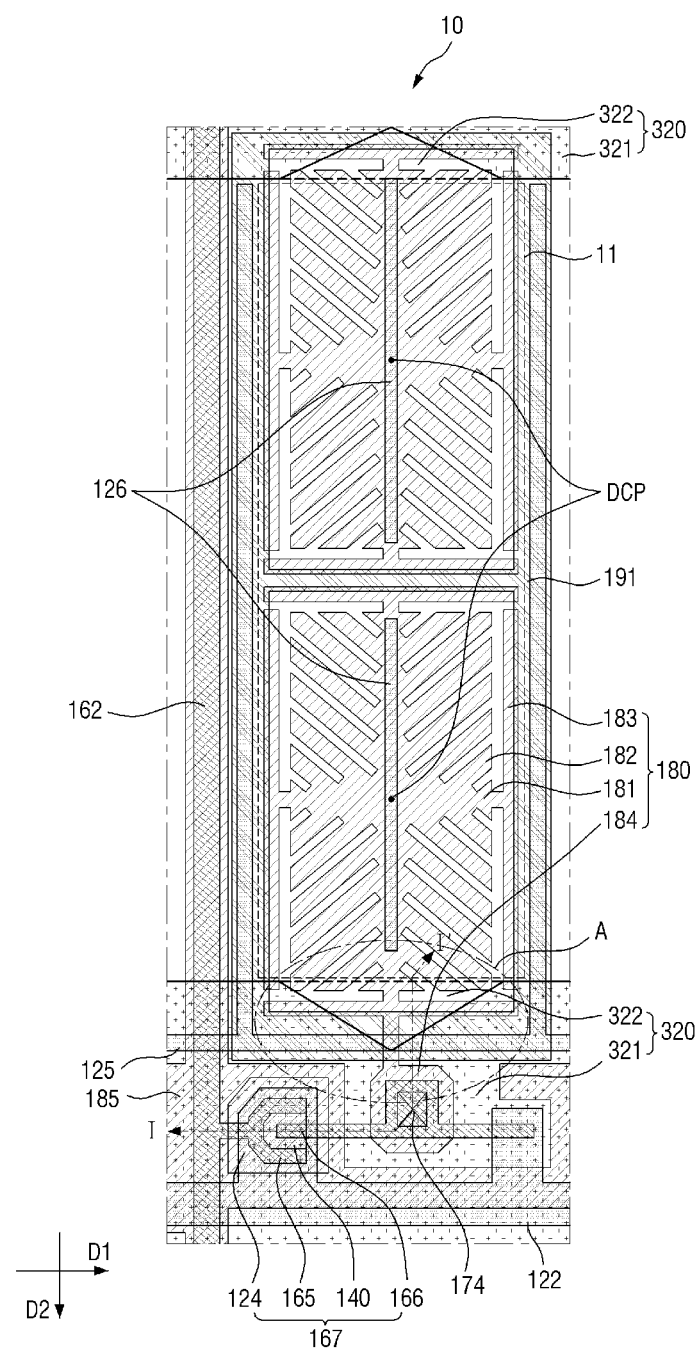
FIG. 1 is a plan view of an exemplary embodiment of a pixel of a liquid crystal display ("LCD") device according to the invention.

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will be understood that, although the terms first, second, third, etc., may be used herein to describe various elements, these elements should not be limited by these terms. These terms are only used to distinguish one element from another element. Thus, a first element discussed below could be termed a second element without departing from the teachings of the invention.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, when the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

In the invention, an electronic apparatus may be any apparatus provided with a display device. Examples of the electronic apparatus may include smart phones, mobile phones, navigators, game machines, TVs, car head units, notebook computers, laptop computers, tablet computers, personal media players ("PMPs"), and personal digital assistants ("PDAs"). The electronic apparatus may be embodied as a pocket-sized portable communication terminal having a wireless communication function, for example. Further, the display device may be a flexible display device capable of changing its shape, for example.

Hereinafter, exemplary embodiments of the invention will be described with reference to the accompanying drawings.

Figure 2:
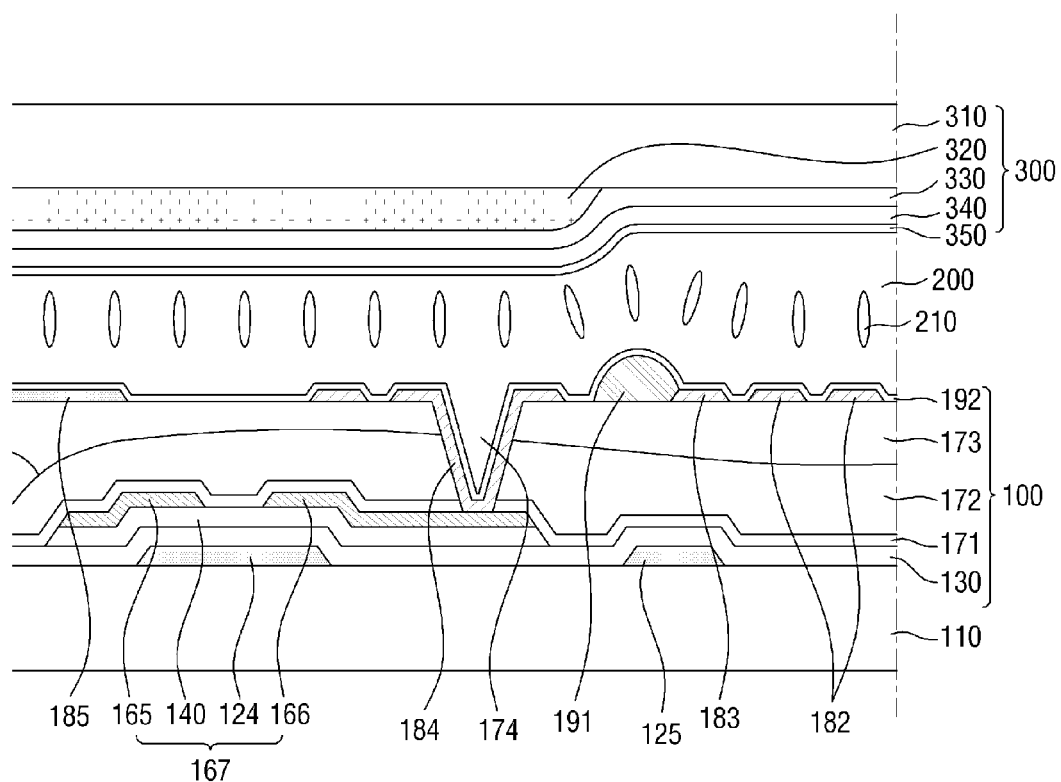
FIG. 2 is a cross-sectional view taken along line I-I' of FIG. 1.

FIG. 1 is a plan view of a pixel of a liquid crystal display ("LCD") device according to an exemplary embodiment of the invention, and FIG. 2 is a cross-sectional view taken along line I-I' of FIG. 1.

Referring to FIGS. 1 and 2, the LCD device according to the illustrated exemplary embodiment includes a first display substrate 100, a second display substrate 300 and a liquid crystal layer 200. The LCD device according to the illustrated exemplary embodiment may further include a pair of polarizers (not illustrated), which are attached on the outer surfaces of the first display substrate 100 and the second display substrate 300.

A switching device for driving liquid crystal molecules 210 in the liquid crystal layer 200, for example, a thin-film transistor ("TFT") 167, is provided in the first display substrate 100. The second display substrate 300 is a counter substrate facing the first display substrate 100.

The liquid crystal layer 200 may be interposed between the first and second display substrates 100 and 300, and may include the liquid crystal molecules 210, which have dielectric anisotropy. In response to an electric field being applied between the first and second display substrates 100 and 300, the liquid crystal molecules 210 may rotate in a predetermined direction between the first and second display substrates 100 and 300 so as to allow or block the transmission of light through the liquid crystal layer 200. The term "rotation of the liquid crystal molecules 210", as used herein, not only means that the liquid crystal molecules 210 actually rotate, but also means that the alignment of the liquid crystal molecules 210 changes due to an electric field.

The LCD device according to the exemplary embodiment includes more than one pixel 10, which is arranged in a matrix. However, the invention is not limited thereto, and the pixel 10 may not be arranged in a matrix. The gray level of the pixel 10 may be independently controllable. The pixel 10 may be a basic unit for displaying a predetermined color. The pixel 10 includes an active region 11, which transmits light incident thereupon from the bottom of the first display substrate 100 therethrough toward the top of the second display substrate 300 and actually displays a color.

The first display substrate 100 will hereinafter be described.

The first display substrate 100 includes a lower substrate 110. The lower substrate 110 may be a transparent insulating substrate. In an exemplary embodiment, the lower substrate 110 may be a glass substrate, a quartz substrate, or a transparent resin substrate, for example.

In an exemplary embodiment, the lower substrate 110 may be curved along a predetermined direction. In an exemplary embodiment, the first base substrate 110 may have flexibility. That is, the lower substrate 110 may be deformable through rolling, folding, or bending.

A gate line 122, a gate electrode 124, a sustain line 125, a light-shielding line 126 are disposed on the lower substrate 110.

The gate line 122 transmits a gate voltage, which controls the TFT 167. The gate line 122 may extend in a first direction D1.

The first direction D1, which is perpendicular to a second direction D2, may be a direction parallel to one side of the lower substrate 110 on a plane where the lower substrate 110 is disposed, and may be defined as a direction indicated by an arbitrary straight line extending from the left to the right in FIG. 1. The second direction D2 may be defined as a direction indicated by an arbitrary straight line extending from the top to the bottom in FIG. 1.

The gate voltage may be provided by an external source and may have a variable level. The turning on or off of the TFT 167 may be controlled by the level of the gate voltage.

The gate electrode 124 may protrude from the gate line 122 and may be physically connected to the gate line 122. The gate electrode 124 may be an element of the TFT 167, which will be described later.

The sustain line 125 may be disposed between the gate line 122 and another gate line 122. The sustain line 125 may substantially extend in the first direction D1 and may also extend along the edge of the active region 11. The sustain line 125 may be adjacent to the edge of a pixel electrode 180, which will be described later, and a predetermined capacitance may be provided between the pixel electrode 180 and the sustain line 125. Accordingly, a sudden drop in a voltage provided to the pixel electrode 180 may be prevented. In a case in which a drop in the voltage provided to the pixel electrode 180 is tolerable or not significant enough to adversely affect the display quality of the LCD device according to the illustrated exemplary embodiment in the absence of the sustain line 125, the sustain line 125 may not be provided.

The light-shielding line 126 may extend along the second direction D2 and may be physically separated from the gate line 122, the gate electrode 124, and the sustain line 125. The light-shielding line 126 may overlap a stem electrode 181 of the pixel electrode 180, which will be described later. The light-shielding line 126 may block the transmission of light in an area where the light-shielding line 126 is disposed. Accordingly, the occurrence of light leakage along the stem electrode 181 may be minimized. The light-shielding line 126 may maintain a floated state, i.e., a state in which no predetermined voltage is applied. In another exemplary embodiment, the light-shielding line 126 may not be provided. In another exemplary embodiment, the light-shielding line 126 may be disposed at the same location as that illustrated in FIG. 1, but in a different layer from that illustrated in FIG. 1, and may include a material that forms a data line 162, which will be described later.

The gate line 122, the gate electrode 124, the sustain line 125, and the light-shielding line 126 may include the same material. In an exemplary embodiment, the gate line 122, the gate electrode 124, the sustain line 125, and the light-shielding line 126 may include aluminum (Al), an Al-based metal such as an Al alloy, silver (Ag), a Ag-based metal such as a Ag alloy, copper (Cu), a Cu-based metal such as a Cu alloy, molybdenum (Mo), a Mo-based metal such as a Mo alloy, chromium (Cr), tantalum (Ta), titanium (Ti), or the like, for example. The gate electrode 124, the sustain line 125, and the light-shielding line 126 may have a single-layer structure or may have a multilayer structure including two conductive films having different physical properties.

A first insulating layer 130 is disposed on the gate electrode 124, the sustain line 125, and the light-shielding line 126. The first insulating layer 130 may include an insulating material. In an exemplary embodiment, the first insulating layer 130 may include silicon nitride or silicon oxide, for example. The first insulating layer 130 may have a single-layer structure or may have a multilayer structure including two insulating films having different physical properties.

A semiconductor layer 140 is disposed on the first insulating layer 130. The semiconductor layer 140 may at least partially overlap the gate electrode 124. In an exemplary embodiment, the semiconductor layer 140 may include amorphous silicon, polycrystalline silicon, or an oxide semiconductor, for example.

The semiconductor layer 140 may overlap the gate electrode 124 and may also overlap the data line 162, a source electrode 165, and a drain electrode 166, which will be described later.

Although not specifically illustrated, in an exemplary embodiment, ohmic contact members may be additionally provided on the semiconductor layer 140. In an exemplary embodiment, the ohmic contact members may include silicide or n+ hydrogenated amorphous silicon doped with a high concentration of n-type impurities, for example. The ohmic contact members may be disposed on the semiconductor layer 140 in a pair. The ohmic contact members, which are disposed among the source electrode 165, the drain electrode 166, and the semiconductor layer 140, may enable the source electrode 165, the drain electrode 166, and the semiconductor layer 140 to have ohmic contact properties, respectively. In a case in which the semiconductor layer 140 includes an oxide semiconductor, the ohmic contact members may not be provided.

The data line 162, the source electrode 165, and the drain electrode 166 are disposed on the semiconductor layer 140 and the first insulating layer 130.

The data line 162 may extend in the second direction D2 and may intersect the gate line 122.

The data line 162 may be insulated from the gate line 122 and the gate electrode 124 by the first insulating layer 130.

The data line 162 may provide a data voltage to the source electrode 165. The data voltage may be provided by an external source and may have a variable level. The gray level of the pixel 10 may vary depending on the level of the data voltage.

The source electrode 165 may be branched off from the data line 162 and may at least partially overlap the gate electrode 124.

From the viewpoint (i.e., plan view) of FIG. 1, the drain electrode 166 may be spaced apart from the source electrode 165 over the semiconductor layer 140 and may partially overlap the gate electrode 124.

As illustrated in FIG. 1, the source electrode 165 may be C-shaped and may surround the drain electrode 166 with a predetermined gap therebetween, for example. In an alternative exemplary embodiment, the source electrode 165 may be bar-shaped and may extend in parallel to, and at a predetermined distance from, the drain electrode 166, but the invention is not limited thereto.

The data line 162, the source electrode 165, and the drain electrode 166 may include the same material. In an exemplary embodiment, the data line 162, the source electrode 165, and the drain electrode 166 may include Al, Cu, Ag, Mo, Cr, Ti, Ta or an alloy thereof, for example. The data line 162, the source electrode 165, and the drain electrode 166 may have a multilayer structure including a lower film (not illustrated) including a refractory metal and a low-resistance upper film (not illustrated) disposed on the lower film, but the invention is not limited thereto.

The gate electrode 124, the semiconductor layer 140, the source electrode 165, and the drain electrode 166 may form the TFT 167, which is a switching device.

A passivation layer 171 is disposed on the first insulating layer 130 and the TFT 167. The passivation layer 171 may include an inorganic insulating material and may cover the TFT 167. The passivation layer 171 may protect the TFT 167 and may prevent the materials of a color filter layer 172 and a second insulating layer 173, which will be described later, from infiltrating into the semiconductor layer 140.

The color filter layer 172 is disposed on the passivation layer 171. The color filter layer 172 may include a photosensitive organic composition including a pigment for realizing a color, and the pigment may include any one of red, green and blue pigments, for example. In an exemplary embodiment, the color filter layer 172 may include a plurality of color filters. In an exemplary embodiment, each of the plurality of color filters may display any one of a number of primary colors such as red, green, and blue, but the invention is not limited thereto. That is, in another exemplary embodiment, each of the plurality of color filters may display any one of other colors such as cyan, magenta, yellow, and white colors.

The second insulating layer 173 is disposed on the color filter layer 172. The second insulating layer 173 may include an insulating material. In an exemplary embodiment, the second insulating layer 173 may be an organic layer including an organic material. The second insulating layer 173 may planarize any regional height difference that may be generated by elements provided between the second insulating layer 173 and the lower substrate 110. In other words, the top surface of the second insulating layer 173 may be substantially flat.

A contact hole 174, which exposes a part of the TFT 167, particularly, a part of the drain electrode 166, in a direction (i.e., cross-sectional direction) perpendicular to the top surface of the lower substrate 110, may be defined in the passivation layer 171, the color filter layer 172, and the second insulating layer 173. The contact hole 174 may penetrate the passivation layer 171, the color filter layer 172, and the second insulating layer 173 in the direction perpendicular to the top surface of the lower substrate 110. A part of the drain electrode 166 and the pixel electrode 180, which is disposed on the second insulating layer 173, may be physically connected to each other via the contact hole 174.

The pixel electrode 180 and a shielding electrode 185 are disposed on the second insulating layer 173. The pixel electrode 180 and the shielding electrode 185 may be disposed on the same plane and do not overlap each other.

The pixel electrode 180 may be physically connected to the drain electrode 166 via the contact hole 174 and may receive the data voltage from the drain electrode 166.

In an exemplary embodiment, the pixel electrode 180 may include a transparent conductive material such as indium tin oxide ("ITO"), indium zinc oxide ("IZO"), indium tin zinc oxide ("ITZO"), or Al-doped zinc oxide ("AZO").

The pixel electrode 180 may generally be disposed within the active region 11 and may include an expanded portion (for example, an expansion electrode 184), which overlaps the contact hole 174 and is connected to the drain electrode 166. Openings in which no transparent conductive material is provided may be defined in the pixel electrode 180. Due to the presence of the openings, a regular pattern is provided on the pixel electrode 180, and the direction in which, and the degree to which, the liquid crystal molecules 210 overlapping the pixel electrode 180 are tilted may be controlled according to the shape and the pattern of the pixel electrode 180.

The pixel electrode 180 may include the stem electrode 181, branch electrodes 182, edge electrodes 183, and the expansion electrode 184.

The stem electrode 181 may extend in the first and second directions D1 and D2 and may be staggered in a cross form within the active region 11. In the illustrated exemplary embodiment, the stem electrode 181 may have a shape obtained by combining two crosses together. The stem electrode 181 may connect the branch electrodes 182, the edge electrodes 183, and the expansion electrode 184. In other words, the branch electrodes 182, the edge electrodes 183, and the expansion electrode 184 may extend from the stem electrode 181. The centers of two cross-shaped parts that form the stem electrode 181 will hereinafter be defined as domain central points DCP.

In the illustrated exemplary embodiments, two domain central points DCP may be provided, but the invention is not limited thereto. In an alternative exemplary embodiment, only one domain central point DCP or three or more domain central points DCP may be provided. As the number of domain central points DCP provided in the stem electrode 181 increases, the direction in which the branch electrodes 182 may further diversify.

The branch electrodes 182 may extend from the stem electrode 181 in directions inclined from the first and second directions D1 and D2, i.e., in oblique directions not parallel to the first and second directions D1 and D2. The branch electrodes 182 may not necessarily extend in the same direction, but in different directions.

That is, the stem electrode 181 may extend in a direction away from each of the domain central points DCP. In the illustrated exemplary embodiments, the branch electrodes 182 may extend in directions away from each of two domain central points DCP.

The edge electrodes 183 may extend in the first and second directions D1 and D2 along the edge of the pixel electrode 180 and may be connected to the ends of the stem electrode 181. In other words, the edge electrodes 183 may extend in the first and second directions D1 and D2 along the edge of the active region 11. In a case in which two domain central points DCP are provided, the pixel electrode 180 may be largely divided into two areas including the two domain central points DCP, respectively, and the edge electrodes 183 may be disposed along the edges of the two areas. That is, in the illustrated exemplary embodiment, two edge electrodes 183, which extend across the center of the active region 11 along the first direction D1, may be additionally provided.

The expansion electrode 184 may extend beyond the active region 11. The expansion electrode 184 may extend from the stem electrode 181 and may overlap the contact hole 174. The expansion electrode 184 may be physically connected to the drain electrode 166 via the contact hole 174 and may receive the data voltage. The data voltage provided to the expansion electrode 184 may be transmitted to the stem electrode 181, the branch electrodes 182, and the edge electrodes 183 of the pixel electrode 180.

The shielding electrode 185 is disposed on the same layer as that on which the pixel electrode 180 is disposed. The shielding electrode 185 may adjoin the pixel electrode 180 or to be a predetermined distance apart from the pixel electrode 180, and may not be physically and electrically connected to the pixel electrode 180. Accordingly, the data voltage provided to the pixel electrode 180 may not be transmitted to the shielding electrode 185.

In an exemplary embodiment, the shielding electrode 185 may include a transparent conductive material such as ITO, IZO, ITZO, or AZO and may include the same material as that of the pixel electrode 180.

The shielding electrode 185 may overlap an entire non-active region (i.e., an entire region except for the active region 11) except for a region where a part of the pixel electrode 180 is provided, but the invention is not limited thereto. That is, the shielding electrode 185 may not necessarily overlap the entire non-active region except for the region where the part of the pixel electrode 180 is disposed, but may overlap the non-active region except for some other regions.

The shielding electrode 185 may also overlap the data line 162. Thus, the liquid crystal molecules 210, which overlap the data line 162, may be prevented from being affected by the data voltage provided to the data line 162, and as a result, light leakage may be prevented.

A protrusion pattern 191 is disposed on the pixel electrode 180 and the shielding electrode 185. The protrusion pattern 191 may be disposed along the edge of the pixel electrode 180 to surround the pixel electrode 180. Since two domain central points DCP are provided in the illustrated exemplary embodiment, the protrusion pattern 191 may surround each of the two domain central points DCP. Accordingly, the protrusion pattern 191 may be disposed along the outer edge of the active region 11 and may extend across the center of the active region 11 along the first direction D1.

More specifically, the protrusion pattern 191 may extend to partially overlap the outer sides of the edge electrodes 183 of the pixel electrode 180.

The protrusion pattern 191 may be an organic layer including an organic material having transparency. The protrusion pattern 191 may be thicker than the pixel electrode 180 in a cross-sectional direction. Due to the presence of the protrusion pattern 191, the liquid crystal layer 200, which will be described later, may have a height difference, and the force by which the liquid crystal molecules 210 are controlled in a predetermined direction may be strengthened by the height difference. Also, due to the presence of the protrusion pattern 191, the liquid crystal molecules 210 in the liquid crystal layer 200 may be smoothly controlled, even when no opening for forming a predetermined pattern on the common electrode 340, which will be described later, is defined.

A three for controlling the liquid crystal molecules 210 to be tilted toward the inside of the protrusion pattern 191 may be strengthened in a region where the height difference provided by the protrusion pattern 191 is provided, and a force for controlling the liquid crystal molecules 210 to be tilted toward the outside of the protrusion pattern 191 may be strengthened in a region outside the protrusion pattern 191. This will be described later with reference to FIG. 3.

A first alignment layer 192 may be disposed on the protrusion pattern 191. The first alignment layer 192 may control the initial alignment angle of the liquid crystal molecules 210 injected into the liquid crystal layer 200. In another exemplary embodiment, the first alignment layer 192 may not be provided.

The second display substrate 300 will hereinafter be described.

The second display substrate 300 may include an upper substrate 310, a light-shielding member 320, an overcoat layer 330, a common electrode 340, and a second alignment layer 350.

The second base substrate 310 may face the first base substrate 110. The second base substrate 310 may be durable enough to withstand external shock. The second base substrate 310 may be a transparent insulating substrate. In an exemplary embodiment, the second base substrate 310 may be a glass substrate, a quartz substrate, a transparent resin substrate, or the like, for example. The second base substrate 310 may have the shape of a flat plate, or may be curved in a predetermined direction.

The light-shielding member 320 is disposed on a surface of the second base substrate 310 that faces the first display substrate 100. The light-shielding member 320 may overlap the gate line 122, the data line 162, the TFT 167, and the contact hole 174. In other words, the light-shielding member 320 may overlap the non-active region, which is the region other than the active region 11, and may block the transmission of light in the non-active region.

However, the invention is not limited to the illustrated exemplary embodiment. That is, the light-shielding member 320 may be disposed in the entire non-active region except for a part of the data line 162 near the pixel electrode 180. In this case, a part of the data line 162 not overlapping the light-shielding member 320 may overlap the shielding electrode 185 to block the transmission of light therethrough. In a case in which the light-shielding member 320 is provided as multiple stripes extending over multiple pixels 10 along the first direction D1, the misalignment of the light-shielding member 320 may be minimized, even when the LCD device according to the illustrated exemplary embodiment is curved along an arbitrary straight line extending in the second direction D2.

The light-shielding member 320 may be an organic layer including an organic material that does not transmit light therethrough. The light-shielding member 320 may have a considerable thickness and may thus form a height difference on the liquid crystal layer 200 along the edge of the light blocking member 320.

The light-shielding member 320 includes light-shielding parts 321 and indentation pattern parts 322.

The light-shielding parts 321 may be opaque parts that do not transmit light therethrough and may correspond to portions of the entire light-shielding member 320 except for regions where the indentation pattern parts 322 are disposed. More specifically, the height difference provided by the light-shielding member 320 may be provided along the edge of each of the light-shielding parts 321.

The indentation pattern parts 322 may correspond to parts of the edge of the light-shielding member 320 that are inwardly indented in a plan view (i.e., from the viewpoint of FIG. 1), and the regions where the indentation pattern parts 322 are disposed may transmit light therethrough. A height difference provided by each of the indentation pattern parts 322 may be provided along the edge of each of the light-shielding parts 321. Since the indentation pattern parts 322 are parts of the light-shielding member 320, the indentation pattern parts 322 are not classified into the active region 11, but may exceptionally transmit light therethrough.

The indentation pattern parts 322 may be defined along the edge of the active region 11. More specifically, the indentation pattern parts 322 may be defined along the edge of the pixel electrode 180 to overlap parts of the pixel electrode 180, In the illustrated exemplary embodiment, the indentation pattern parts 322 overlap the ends of the stem electrode 181, parts of the branch electrodes 182 near the ends of the stem electrode 181, and the edge electrodes 183, which extend from the ends of the stem electrode 181, but the invention is not limited thereto. That is, in an alternative exemplary embodiment, the indentation pattern parts 322 may only overlap the edge electrodes 183.

Since the indentation pattern parts 322 are inwardly indented from the edge of the light-shielding member 320 in a plan view (i.e., from the viewpoint of FIG. 1), first sides of the indentation pattern parts 322 may be straight lines coinciding with sides of the light-shielding member 320. In a plan view, all the other sides of each of the indentation pattern parts 322 may not be parallel to a direction in which parts of the protrusion pattern 191 adjacent to the indentation pattern parts 322 extend. That is, the indentation pattern parts 322 may be indented such that the tangent lines between the indentation pattern parts 322 and the light-shielding parts 321 are not parallel to the direction in which the parts of the protrusion pattern 191 adjacent to the indentation pattern parts 322 extend in a plan view.

A maximum of one indentation pattern part 322 may be provided at each of the sides of the active region 11 in a plan view. That is, a maximum of one indentation pattern part 322 may be provided adjacent to each of the sides of the pixel electrode 180 in a plan view. Accordingly, a total of four indentation pattern parts 322 may be provided at upper, lower, left, and right sides, respectively, of the pixel electrode 180 in a plan view.

In the illustrated exemplary embodiment, since the light-shielding member 320 extends in the first direction D1 and is adjacent only to the upper and lower sides of the pixel electrode 180, a total of two indentation pattern units 322 may be provided at the upper and lower sides, respectively, of the pixel electrode 180.

The increase of a control force for the liquid crystal molecules 210 by the relative arrangement of the light-shielding member 320 and the protrusion pattern 191 may be maximized by limiting the number of indentation pattern parts 322, and this will be described later with reference to FIG. 3.

In a plan view, each of the indentation pattern parts 322 may be symmetrical with respect to an arbitrary straight line extending from a point where a corresponding indentation pattern part 322 is maximally indented toward the edge of the light-shielding member 320. That is, for example, each of the indentation pattern parts 322 may have the shape of an isosceles triangle, but the shape of the indentation pattern parts 322 is not limited thereto. Various other examples of the shape of the indentation pattern parts 322 will be described later.

The overcoat layer 330 is disposed on a surface of the light-shielding member 320 that faces the first display substrate 100. The overcoat layer 330 may reduce any height difference provided by the light-shielding member 320. In another exemplary embodiment, the overcoat layer 330 may not be provided.

The common electrode 340 is disposed on a surface of the overcoat layer 330 that faces the first display substrate 100.

In an exemplary embodiment, the common electrode 340 may include a transparent conductive material such as ITO, IZO, ITZO, or AZO.

The common electrode 340 may be disposed on the entire surface of the second base substrate 310 as a plate. That is, the common electrode 340 may be provided as a plate in which no opening with any pattern is defined over multiple pixels 10. As mentioned above, since the protrusion pattern 191 is provided in the first display substrate 100, a sufficient control force for the liquid crystal molecules 210 may be secured regardless of the presence or absence of openings with a pattern in the common electrode 340.

A common voltage provided by an external source may be provided to the common electrode 340, and thus, the common electrode 340 may generate an electric field in the liquid crystal layer 200 together with the pixel electrode 180.

The common voltage may be provided by the external source, and the level of the common voltage may be uniformly maintained during the operation of the LCD device according to the illustrated exemplary embodiment. Accordingly, an electric field may be generated in the space between the pixel electrode 180 and the common electrode 340, which overlap each other, due to a difference between the data voltage provided to the pixel electrode 180 and the common voltage provided to the common electrode 340. Due to the electric field, the liquid crystal molecules 210 may be rotated or tilted.

In an exemplary embodiment, a voltage having substantially the same level as the common voltage may be provided to the shielding electrode 185. Thus, no electric field with directivity may be generated in a part of the liquid crystal layer 200 between the shielding electrode 185 and the common electrode 340, which overlap each other, during the operation of the LCD device according to the illustrated exemplary embodiment because the shielding electrode 185 and the common electrode 340 are provided with signals having the same voltage and thus, no electric potential is generated therebetween. Accordingly, the liquid crystal molecules 210 may not be rotated or tilted in the space between the shielding electrode 185 and the common electrode 340, which overlap each other, and may maintain the same state as that in a case in which the LCD device according to the illustrated exemplary embodiment is powered off. As a result, the liquid crystal molecules 210 may block the transmission of light.

The second alignment layer 350 is disposed on a surface of the common electrode 340 that faces the first display substrate 100. The second alignment layer 350, like the first alignment layer 192, may control the initial alignment angle of the liquid crystal molecules 210 in the liquid crystal layer 200. In another exemplary embodiment, the second alignment layer 350 may not be provided.

The liquid crystal layer 200 will hereinafter be described.

The liquid crystal layer 200 includes the liquid crystal molecules 210, which have dielectric anisotropy and refractive anisotropy. The liquid crystal molecules 210 may be aligned in a vertical direction with respect to the first and second display substrates 100 and 300 in the absence of an electric field in the liquid crystal layer 200. In response to an electric field being generated between the first and second display substrates 100 and 300, the liquid crystal molecules 210 may be rotated or tilted in a predetermined direction between the first and second display substrates 100 and 300, thereby changing the polarization of light.

It will hereinafter be described how to alleviate a conflict between a control force for the liquid crystal molecules 210, provided by the light-shielding member 320, and a control force for the liquid crystal molecules 210, provided by the protrusion pattern 191, will hereinafter be described.

Figure 3:
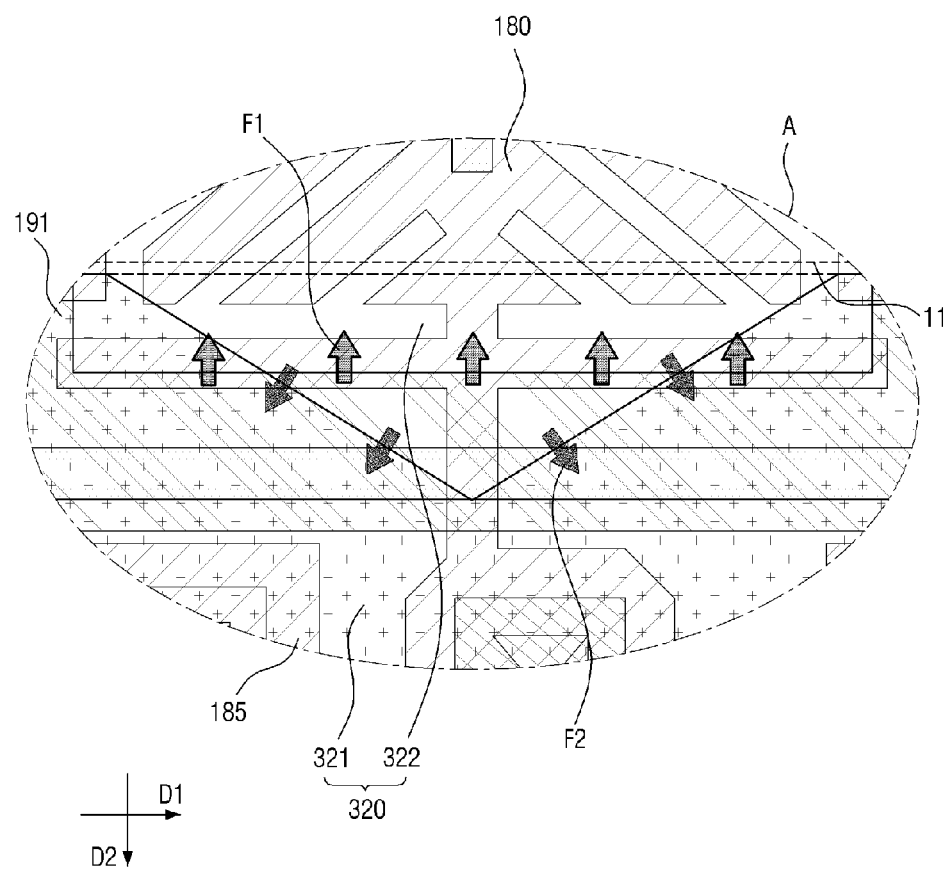
FIG. 3 is an enlarged plan view of an area A of FIG. 1.

FIG. 3 is an enlarged plan view of an area A of FIG. 1.

FIG. 3 illustrates only the pixel electrode 180 and the shielding-electrode 185, the protrusion pattern 191, and the light-shielding member 320, which are disposed on the same layer as that on which the pixel electrode 180 is disposed, for convenience. A direction in which a control force for the liquid crystal molecules 210 (refer to FIG. 2) is affected by each of the shielding-electrode 185, the protrusion pattern 191, and the light-shielding member 320 will hereinafter be described with reference to FIG. 3.

Referring to FIG. 3, the more the liquid crystal molecules 210 are controlled to face the inside of the active region 11, the less likely the liquid crystal molecules 210 become to be misaligned. That is, the stronger the force for controlling the liquid crystal molecules 210 to face the inside of the active region 11 is, the more the control force for the liquid crystal molecules 210 is improved.

The protrusion pattern 191 forms a height difference on the lower substrate 110, and thus, liquid crystal molecules 210 near the protrusion pattern 191 may be controlled to face a direction away from the protrusion pattern 191. More specifically, liquid crystal molecules 210 disposed on the inside of the protrusion pattern 191 may receive a force F1 directed toward the inside of the protrusion pattern 191, and liquid crystal molecules 210 disposed on the outside of the protrusion pattern 191 may receive a force directed toward the outside of the protrusion pattern 191. In the illustrated exemplary embodiment, since the active region 11 is disposed inside the protrusion pattern 191, the arrangement of the liquid crystal molecules 210 within the active region 11 is important. Thus, only the force F1, which is received by the liquid crystal molecules 210 disposed on the inside of the protrusion pattern 191, is illustrated. That is, the liquid crystal molecules 210 disposed on the inside of the protrusion pattern 191 may receive the force F1 from the protrusion pattern 191 in a direction toward the inside of the active region 11. More specifically, in the illustrated exemplary embodiment, the liquid crystal molecules 210 disposed on the inside of the protrusion pattern 191 may receive the force F1, which tilts the liquid crystal molecules 210 upwardly in a plan view, from the protrusion pattern 191.

Since the light-shielding member 320 is disposed on the upper substrate 310, liquid crystal molecules 210 disposed along the edge of the upper substrate 310 may receive a force F2, which tilts the liquid crystal molecules 210 toward a direction in which the light-shielding member 320 is arranged, from the light-shielding member 320. That is, in the illustrated exemplary embodiment, the liquid crystal molecules 210 disposed along the edge of the light-shielding member 320 may receive the force F2, which tilts the liquid crystal molecules 210 downwardly in a plan view, from the light-shielding member 320.

The force F1, which is generated for the liquid crystal molecules 210 by the protrusion pattern 191, and the force F2, which is generated for the liquid crystal molecules 210 by the light-shielding member 320, may be directed to opposite directions and may thus conflict with each other. In this case, the liquid crystal molecules 210 may be misaligned due to an insufficient control force for the liquid crystal molecules 210.

In the illustrated exemplary embodiment, since the indentation pattern parts 322 are provided in the light-shielding member 320, a conflict between the force F1 and the force F2 may be alleviated. More specifically, the tangent lines between the indentation pattern parts 322 and the light-shielding parts 321 may extend not in parallel to the directions in which the protrusion pattern 191 extends. Accordingly, the height difference provided by the light-shielding member 320 may be provided along each of the tangential lines between the indentation pattern parts 322 and the light-shielding parts 321 and may extend in an oblique direction with respect to the edge of the protrusion pattern 191.

As a result, the force F1, which is applied to the liquid crystal molecules 210 by the protrusion pattern 191, and the force F2, which is applied to the liquid crystal molecules 210 by the light-shielding member 320, may be provided in directions that are not completely opposite to each other. Accordingly, the conflict between the force F2, which is generated for the liquid crystal molecules 210 by the light-shielding member 320, and the force F1, which is generated for the liquid crystal molecules 210 by the protrusion pattern 191, may be minimized.

Therefore, a sufficient control force may be provided for the liquid crystal molecules 210 disposed on the inside of the protrusion pattern 191, and as a result, even when the liquid crystal molecules 210 are misaligned by external pressure, a sufficient force for correcting the misaligned liquid crystal molecules 210 may be secured. That is, a conflict between a control force for the liquid crystal molecules 210, provided by the light-shielding member 320, and a control force for the liquid crystal molecules 210, provided by the protrusion pattern 191, may be alleviated.

Figure 4:
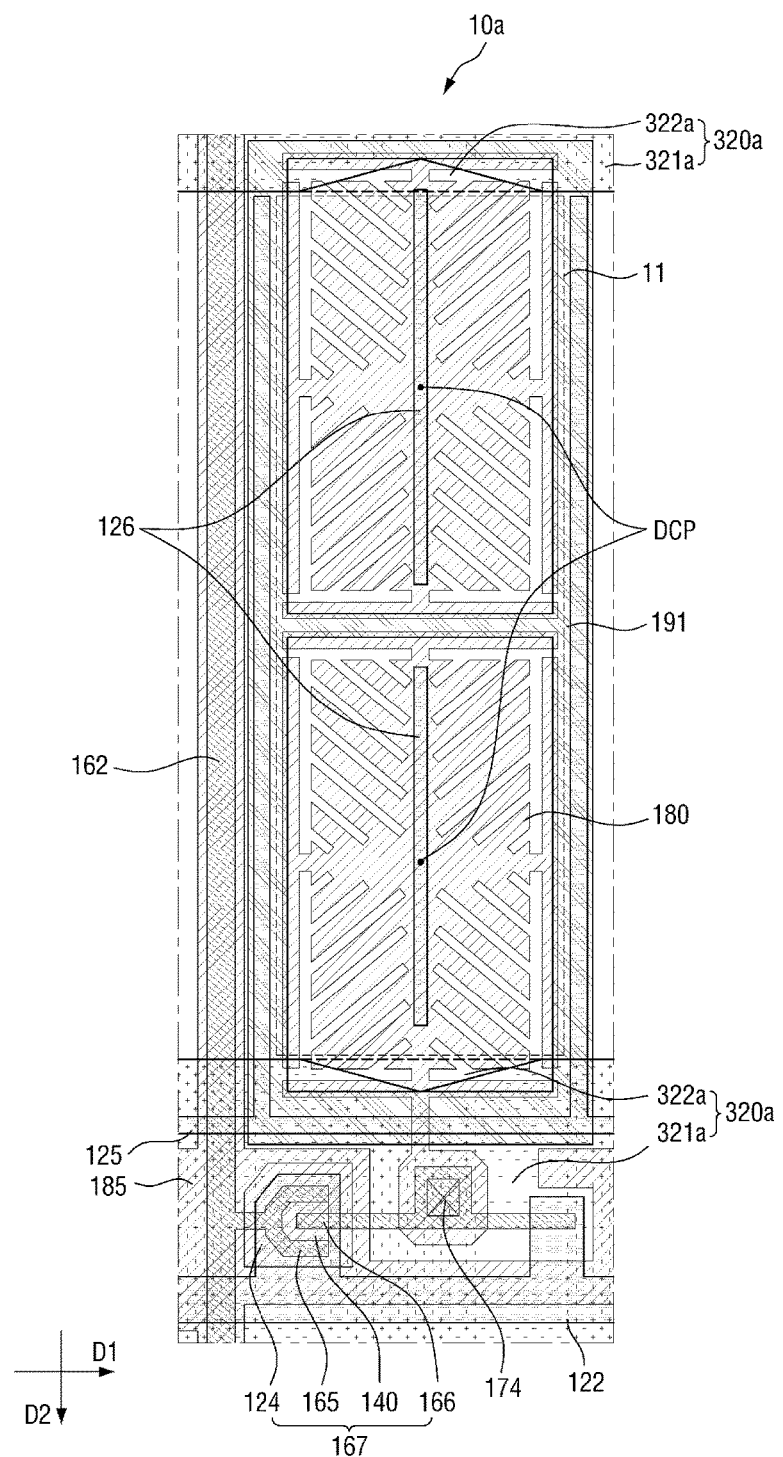
FIG. 4 is a plan view of another exemplary embodiment of a pixel of an LCD device according to the invention.

FIG. 4 is a plan view of a pixel of an LCD device according to another exemplary embodiment of the invention.

A pixel 10a of the LCD device according to the illustrated exemplary embodiment differs from the pixel 10 of the LCD device according to the exemplary embodiment of FIG. 1 in the length of indentation pattern parts 322a, and the indentation pattern parts 322a may be shorter than the indentation pattern parts 322 of FIG. 1. The LCD device according to the illustrated exemplary embodiment will hereinafter be described, focusing mainly on the difference with the LCD device according to the exemplary embodiment of FIG. 1.

Referring to FIG. 4, the indentation pattern parts 322a are indented from the edge of a light-shielding member 320a, but may not overlap a protrusion pattern 191.

That is, in the pixel 10 of the LCD device according to the exemplary embodiment of FIG. 1, the indentation pattern parts 322 are deeply indented such that the indentation pattern parts 322 partially overlap the protrusion pattern 191. The indentation pattern parts 322a may be relatively shallowly indented.

Accordingly, the occurrence of light leakage in the indentation pattern parts 322a may be minimized. More specifically, in response to voltages being provided to a pixel electrode 180 and a common electrode 340 so as to generate an electric field, liquid crystal molecules 210 in a liquid crystal layer 200 may be tilted by the electric field and may thus transmit light therethrough, and in the absence of an electric field between the pixel electrode 180 and the common electrode 340, even parts of the pixel 10a not covered by light-shielding parts 321a are supposed to appear dark. However, since the protrusion pattern 191 applies a force to tilt the liquid crystal molecules 210, at least to some extent, regardless of the presence or absence of an electric field, light leakage may occur in regions near the protrusion pattern 191. Since the indentation pattern parts 322a are indented, but not to the extent that they overlap the protrusion pattern 191, light leakage may be prevented from becoming visible. However, the degree to which the tangent lines between the protrusion pattern 191 and the light-shielding parts 321a are oblique with respect to a direction in which the protrusion pattern 191 extends is relatively lower in the illustrated exemplary embodiment than in the exemplary embodiment of FIG. 1. Thus, an improvement in a control force for the liquid crystal molecules 210 may be smaller in the illustrated exemplary embodiment than in the exemplary embodiment of FIG. 1.

Figure 5:
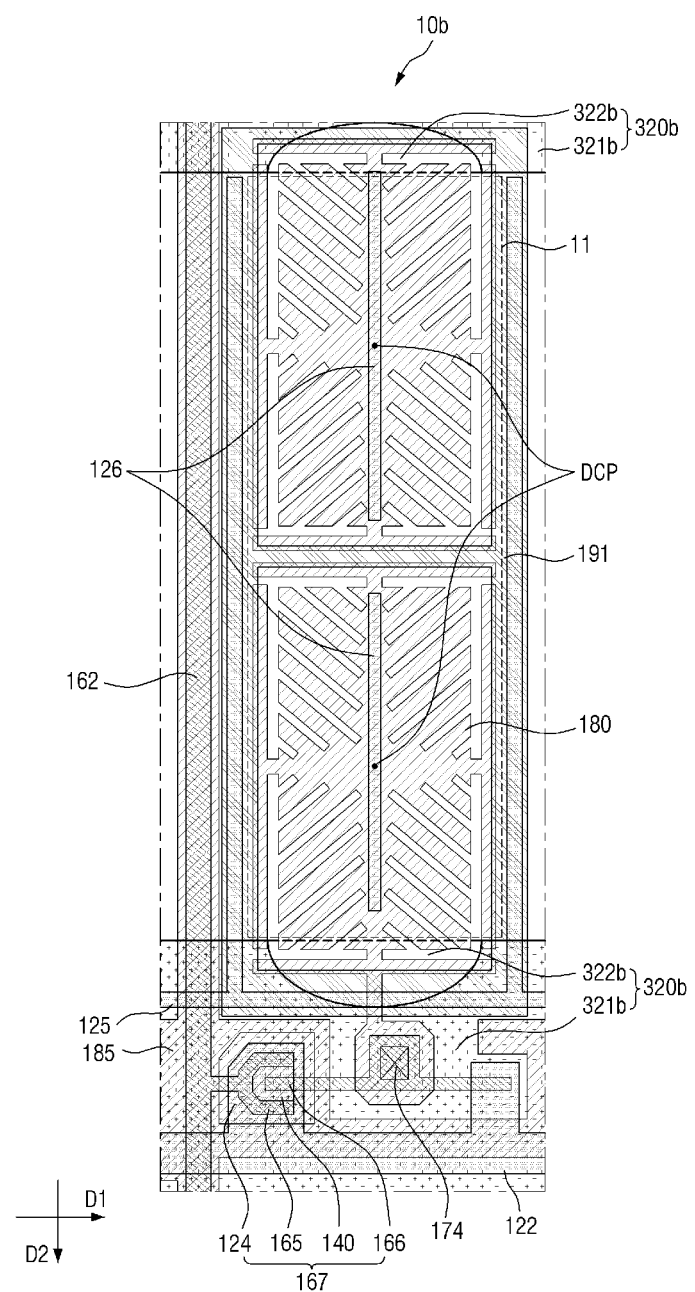
FIG. 5 is a plan view of another exemplary embodiment of a pixel of an LCD device according to the invention.

FIG. 5 is a plan view of a pixel of an LCD device according to another exemplary embodiment of the invention.

A pixel 10b of the LCD device according to the illustrated exemplary embodiment differs from the pixel 10 of the LCD device according to the exemplary embodiment of FIG. 1 in the shape of indentation pattern parts 322b. The LCD device according to the illustrated exemplary embodiment will hereinafter be described, focusing mainly on the difference with the LCD device according to the exemplary embodiment of FIG. 1.

Referring to FIG. 5, each of the indentation pattern parts 322b may have a semi-elliptical shape obtained by dividing an ellipse along the major axis of the ellipse.

That is, in the pixel 10 of the LCD device according to the exemplary embodiment of FIG. 1, each of the indentation pattern parts 322 may have the shape of an isosceles triangle, but the invention is not limited thereto. In an alternative exemplary embodiment, each of the indentation pattern parts 322 may have a semi-elliptical shape obtained by dividing an ellipse along the major axis of the ellipse, as illustrated in FIG. 5.

More specifically, from the viewpoint of FIG. 5, parts of a protrusion pattern 191 adjacent to the indentation pattern parts 322b extend in a first direction D1. Accordingly, the angle that the indentation pattern parts 322b form with the first direction D1 increases closer to the left or right ends of the indentation pattern parts 322b and decreases as closer to the centers of the indentation pattern parts 322b. Thus, the degree to which a conflict between a control force for liquid crystal molecules 210, provided by a light-shielding member 320b, and a control force for liquid crystal molecules 210, provided by the protrusion pattern 191, is alleviated may increase closer to the left or right ends of the indentation pattern parts 322b. The degree to which the conflict between the control force for the liquid crystal molecules 210, provided by the light-shielding member 320b, and the control force for the liquid crystal molecules 210, provided by the protrusion pattern 191, is alleviated may decrease as closer to the centers of the indentation pattern parts 322b.

In the illustrated exemplary embodiment, each of the indentation pattern parts 322b may be curved at one side thereof, and thus, the degree to which the conflict between the control force for the liquid crystal molecules 210, provided by the light-shielding member 320b, and the control force for the liquid crystal molecules 210, provided by the protrusion pattern 191, is alleviated may be controlled to differ from one location to another location.

Figure 6:
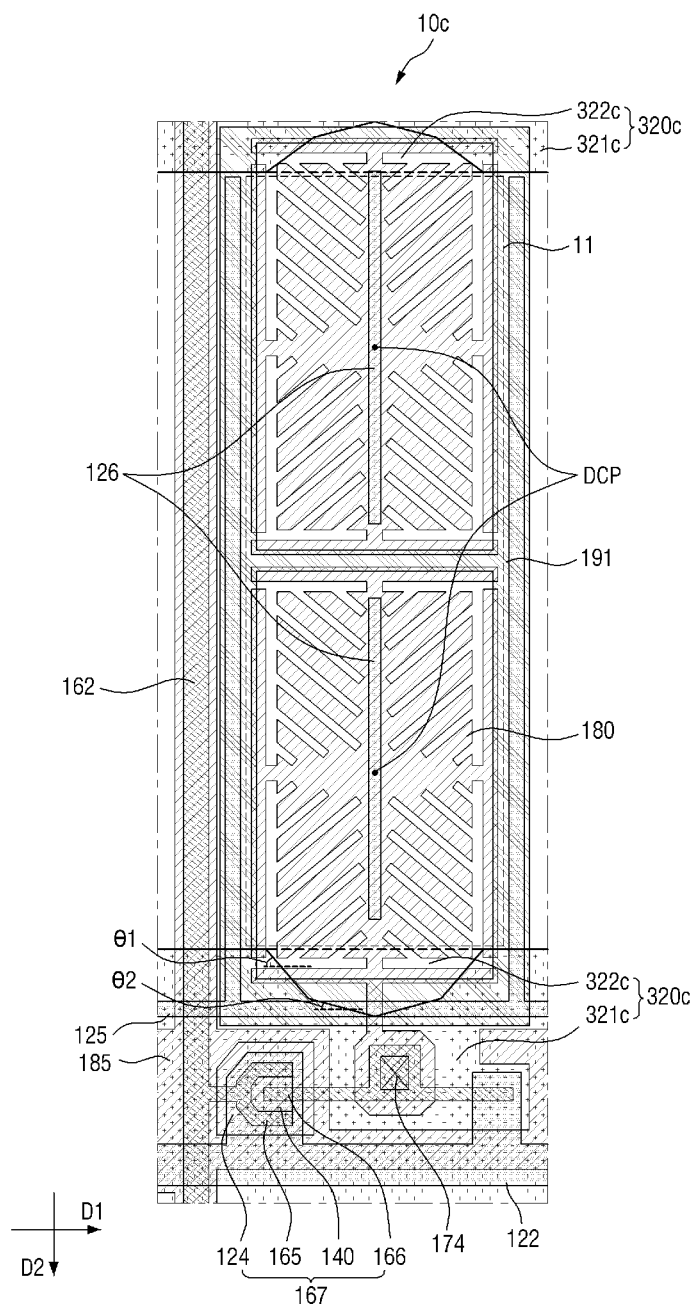
FIG. 6 is a plan view of another exemplary embodiment of a pixel of an LCD device according to the invention.

FIG. 6 is a plan view of a pixel of an LCD device according to another exemplary embodiment of the invention.

A pixel 10c of the LCD device according to the illustrated exemplary embodiment differs from the pixel 10 of the LCD device according to the exemplary embodiment of FIG. 1 in the shape of indentation pattern parts 322c. The LCD device according to the illustrated exemplary embodiment will hereinafter be described, focusing mainly on the difference with the LCD device according to the exemplary embodiment of FIG. 1.

Referring to FIG. 6, the indentation pattern parts 322c may be defined such that the tangent lines between the indentation pattern parts 322c and light-shielding parts 321c may form various angles with a direction in which parts of a protrusion pattern 191 adjacent to the indentation pattern parts 322c extend.

That is, in the exemplary embodiment of FIG. 1, the tangent lines between the indentation pattern parts 322 and the light-shielding parts 321 form only one angle with the first direction D1. In contrast, in the illustrated exemplary embodiment, the tangent lines between the indentation pattern parts 322c and the light-shielding parts 321c may form two different angles, i.e., angles θ1 and θ2, with the first direction D1.

The term "the angle that two directions form with each other", as used herein, denotes the absolute value of the smallest among multiple angles defined by any two straight lines extending in the two directions, respectively.

More specifically, from the viewpoint of FIG. 6, the parts of the protrusion pattern 191 adjacent to the indentation pattern parts 322c extend in the first direction D1. The angle that the tangent lines between the indentation pattern parts 322c and the light-shielding parts 321c form with the first direction D1 in regions near the left or right ends of the indentation pattern parts 322c, i.e., the angle θ1, may be relatively large. The angle that the tangent lines between the indentation pattern parts 322c and the light-shielding parts 321c form with the first direction D1 in regions near the centers of the indentation pattern parts 322c, i.e., the angle θ2, may be relatively small. Accordingly, the degree to which a conflict between a control force for liquid crystal molecules 210, provided by a light-shielding member 320c, and a control force for liquid crystal molecules 210, provided by the protrusion pattern 191, is alleviated may be relatively high in the regions near the left or right ends of the indentation pattern parts 322c. The degree to which the conflict between the control force for the liquid crystal molecules 210, provided by the light-shielding member 320c, and the control force for the liquid crystal molecules 210, provided by the protrusion pattern 191, is alleviated may be relatively low in the regions near the centers of the indentation pattern parts 322c.

In the illustrated exemplary embodiment, by allowing the shape of the indentation pattern parts 322c to diversify, the degree to which the conflict between the control force for the liquid crystal molecules 210, provided by the light-shielding member 320c, and the control force for the liquid crystal molecules 210, provided by the protrusion pattern 191, is alleviated may be controlled to differ from one location to another location.

Figure 7:
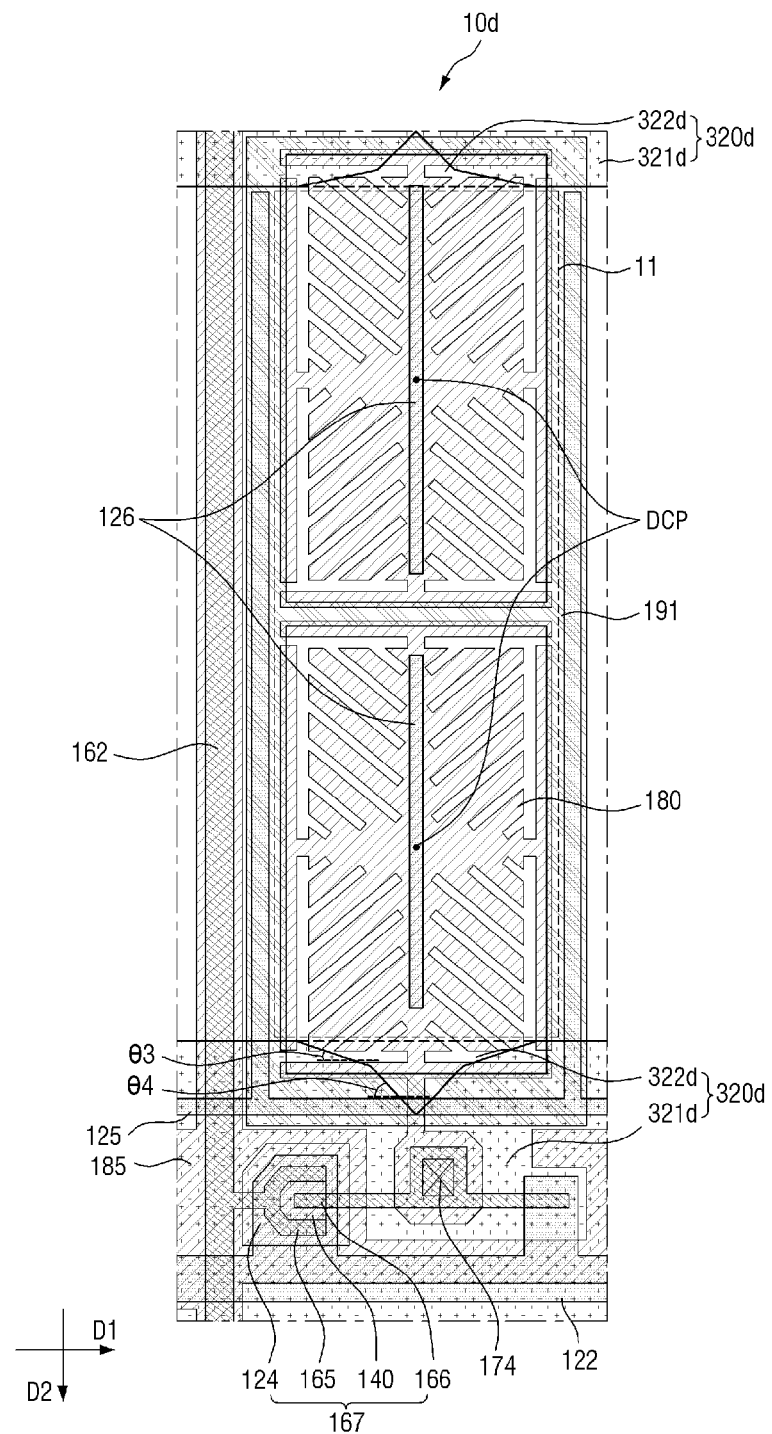
FIG. 7 is a plan view of another exemplary embodiment of a pixel of an LCD device according to the invention.

FIG. 7 is a plan view of a pixel of an LCD device according to another exemplary embodiment of the invention.

A pixel 10d of the LCD device according to the illustrated exemplary embodiment differs from the pixel 10 of the LCD device according to the exemplary embodiment of FIG. 1 in the shape of indentation pattern parts 322d. The LCD device according to the illustrated exemplary embodiment will hereinafter be described, focusing mainly on the difference with the LCD device according to the exemplary embodiment of FIG. 1.

Referring to FIG. 7, the angle that the tangent lines between the indentation pattern parts 322d and light-shielding parts 321d form with a direction in which parts of a protrusion pattern 191 adjacent to the indentation pattern parts 322d extend may decrease as closer to both ends of the indentation pattern parts 322d.

More specifically, from the viewpoint of FIG. 7, the parts of the protrusion pattern 191 extend in a first direction D1. The angle that the tangent lines between the indentation pattern parts 322d and the light-shielding parts 321d form with the first direction D1 in regions near the centers of the indentation pattern parts 322d, i.e., an angle θ4, may be relatively large. The angle that the tangent lines between the indentation pattern parts 322d and the light-shielding parts 321d form with the first direction D1 in regions near the left or right ends of the indentation pattern parts 322d, i.e., an angle θ3, may be relatively small. Accordingly, the degree to which a conflict between a control force for liquid crystal molecules 210, provided by a light-shielding member 320d, and a control force for liquid crystal molecules 210, provided by the protrusion pattern 191, is alleviated may be relatively high in the regions near the centers of the indentation pattern parts 322d. The degree to which the conflict between the control force for the liquid crystal molecules 210, provided by the light-shielding member 320d, and the control force for the liquid crystal molecules 210, provided by the protrusion pattern 191, is alleviated may be relatively low in the regions near the left or right ends of the indentation pattern parts 322d.

In the illustrated exemplary embodiment, by allowing the shape of the indentation pattern parts 322d to diversify, the degree to which the conflict between the control force for the liquid crystal molecules 210, provided by the light-shielding member 320d, and the control force for the liquid crystal molecules 210, provided by the protrusion pattern 191, is alleviated may be controlled to differ from one location to another location.

The effects of the invention are not limited by the foregoing, and other various effects are anticipated herein.

In concluding the detailed description, those skilled in the art will appreciate that many variations and modifications can be made to the preferred embodiments without substantially departing from the principles of the invention. Therefore, the disclosed preferred embodiments of the invention are used in a generic and descriptive sense only and not for purposes of limitation.

What is claimed is:

1. A liquid crystal display device, comprising:
   a first display substrate including:
      a lower substrate;
      a pixel electrode which is disposed on the lower substrate, and
      a protrusion pattern, which is disposed on the pixel electrode along an outer edge of the pixel electrode;
   a second display substrate facing the first display substrate including:
      an upper substrate; and
      a light-shielding member which is disposed on a surface of the upper substrate facing the first display substrate, and in which indentation pattern parts are inwardly indented in a plan view, the light-shielding member including:
         light-shielding parts which are an entirety of the light-shielding member except for the indentation pattern parts; and
   a liquid crystal layer interposed between the first and second display substrates,
   wherein
   the indentation pattern parts overlap parts of the pixel electrode,
   the pixel electrode includes a stem electrode, a plurality of branch electrodes, which extend from the stem electrode, and a plurality of edge electrodes, which extend from the plurality of branch electrodes and are disposed along the edge of the pixel electrode, and
   in the plan view, the protrusion pattern overlaps parts of the plurality of edge electrodes.

2. The liquid crystal display device of claim 1, wherein the indentation pattern parts are indented such that, in the plan view, tangent lines between the indentation pattern parts and the light-shielding parts are not parallel to a direction in which the protrusion pattern extends.

3. The liquid crystal display device of claim 1, wherein first portions of the indentation pattern parts overlap the protrusion pattern, and
   second portions of the indentation pattern parts do not overlap the protrusion pattern.

4. The liquid crystal display device of claim 1, wherein the indentation pattern parts do not overlap the protrusion pattern.

5. The liquid crystal display device of claim 1, wherein each of the indentation pattern parts is symmetrical with respect to an arbitrary straight line extending from a point where a corresponding indentation pattern part is maximally indented toward an edge of the light-shielding member.

6. The liquid crystal display device of claim 1, wherein in the plan view, a maximum of one indentation pattern part is provided at each side of the pixel electrode.

7. The liquid crystal display device of claim 6, wherein in the plan view, a total of four indentation pattern parts are provided at upper, lower, left, and right sides, respectively, of the pixel electrode.

8. A liquid crystal display device, comprising:
   a first display substrate including:
      a lower substrate;
      a pixel electrode which is disposed on the lower substrate, and
      a protrusion pattern, which is disposed on the pixel electrode along an outer edge of the pixel electrode;
   a second display substrate facing the first display substrate including:
      an upper substrate; and
      a light-shielding member which is disposed on a surface of the upper substrate facing the first display substrate, and in which indentation pattern parts are inwardly indented in a plan view, the light-shielding member including:
         light-shielding parts which are an entirety of the light-shielding member except for the indentation pattern parts; and
   a liquid crystal layer interposed between the first and second display substrates,
   wherein
   the indentation pattern parts overlap parts of the pixel electrode, and
   wherein in the plan view, each of the indentation pattern parts has a shape of an isosceles triangle.

9. A liquid crystal display device, comprising:
a first display substrate including:
a lower substrate;
a pixel electrode which is disposed on the lower substrate, and
a protrusion pattern, which is disposed on the pixel electrode along an outer edge of the pixel electrode;
a second display substrate facing the first display substrate including:
an upper substrate; and
a light-shielding member which is disposed on a surface of the upper substrate facing the first display substrate, and in which indentation pattern parts are inwardly indented in a plan view, the light-shielding member including:
light-shielding parts which are an entirety of the light-shielding member except for the indentation pattern parts; and
a liquid crystal layer interposed between the first and second display substrates,
wherein the indentation pattern parts overlap parts of the pixel electrode, and
wherein in the plan view, each of the indentation pattern parts has a semi-elliptical shape obtained by dividing an ellipse along a major axis of the ellipse.

10. The liquid crystal display device of claim 1, wherein in a cross-sectional view, the protrusion pattern is thicker than the pixel electrode.

11. A liquid crystal display device, comprising:
a first display substrate including:
a plurality of pixels arranged in a matrix:
a lower substrate;
a pixel electrode, which is disposed on the lower substrate and is provided for each of the plurality of pixels; and
a protrusion pattern, which is disposed on the pixel electrode extending along an outer edge defining a periphery of the pixel electrode;
a second display substrate facing the first display substrate and including:
an upper substrate; and
a light-shielding member which is disposed on a surface of the upper substrate facing the first display substrate and extends across the plurality of pixels along a first direction, and in which indentation pattern parts are indented from an edge of the light-shielding member along a second direction perpendicular to the first direction in a plan view, the light-shielding member including:
light-shielding parts, which are an entirety of the light-shielding member except for the indentation pattern parts; and
a liquid crystal layer interposed between the first and second display substrates.

12. The liquid crystal display device of claim 11, wherein the indentation pattern parts are indented such that in the plan view, tangent lines between the indentation pattern parts and the light-shielding parts are not parallel to a direction in which the protrusion pattern extends.

13. The liquid crystal display device of claim 11, wherein the first display substrate further includes gate lines, which are disposed in a layer between the lower substrate and the pixel electrode and extend in the first direction.

14. The liquid crystal display device of claim 13, wherein the first display substrate further includes data lines, which are disposed in a layer between the gate lines and the pixel electrode and extend in the second direction.

15. The liquid crystal display device of claim 11, wherein the first display substrate further includes a color filter layer, which is disposed in a layer between the lower substrate and the pixel electrode.

16. The liquid crystal display device of claim 11, wherein a maximum of two indentation pattern parts are provided in each of the plurality of pixels.

17. The liquid crystal display device of claim 16, wherein a maximum of one indentation pattern part is provided at each side of the pixel electrode.

18. The liquid crystal display device of claim 16, wherein the indentation pattern parts are defined at first and second sides of the pixel electrode in the second direction.

19. The liquid crystal display device of claim 11, wherein the second display substrate further includes a common electrode, which is disposed on a surface of the light-shielding member facing the first display substrate, and an opening is not defined in the common electrode.

* * * * *